(12) United States Patent
Cho et al.

(10) Patent No.: US 8,053,313 B2
(45) Date of Patent: Nov. 8, 2011

(54) SEMICONDUCTOR DEVICE AND METHOD OF FABRICATING THE SAME

(75) Inventors: Yun-Seok Cho, Icheon-si (KR);
Sang-Hoon Park, Icheon-si (KR);
Young-Kyun Jung, Icheon-si (KR);
Chun-Hee Lee, Icheon-si (KR)

(73) Assignee: Hynix Semiconductor Inc., Icheon-si, Gyeonggi-do (KR)

( * ) Notice: Subject to any disclaimer, the term of this patent is extended or adjusted under 35 U.S.C. 154(b) by 115 days.

(21) Appl. No.: 12/318,165

(22) Filed: Dec. 23, 2008

(65) Prior Publication Data

US 2009/0242945 A1    Oct. 1, 2009

(30) Foreign Application Priority Data

Apr. 1, 2008   (KR) .................. 10-2008-0030173

(51) Int. Cl.
*H01L 21/336* (2006.01)

(52) U.S. Cl. ........ 438/268; 438/238; 438/243; 438/253; 438/257; 438/259; 257/E21.639

(58) Field of Classification Search .................. 438/222, 438/245, 247, 389
See application file for complete search history.

(56) References Cited

U.S. PATENT DOCUMENTS

| | | | |
|---|---|---|---|
| 6,150,688 A | 11/2000 | Maeda et al. | |
| 6,426,259 B1 | 7/2002 | Yu | |
| 6,610,575 B1 * | 8/2003 | Ang et al. | 438/275 |
| 7,122,425 B2 | 10/2006 | Chance et al. | |
| 2004/0115884 A1 * | 6/2004 | Wang | 438/257 |
| 2005/0048711 A1 * | 3/2005 | Wang | 438/222 |
| 2005/0156202 A1 * | 7/2005 | Rhee et al. | 257/213 |
| 2007/0190766 A1 * | 8/2007 | Seo et al. | 438/585 |

FOREIGN PATENT DOCUMENTS

| | | |
|---|---|---|
| KR | 10-0660881 | 12/2006 |
| KR | 1020090098208 | 9/2009 |

OTHER PUBLICATIONS

Korean Notice of Allowance for Korean application No. 10-2008-0030173.

Office Action dated Jul. 14, 2010, for Chinese application No. 200910129370.4.

* cited by examiner

*Primary Examiner* — N Drew Richards
*Assistant Examiner* — Kyoung Lee
(74) *Attorney, Agent, or Firm* — Lowe Hauptman Ham & Berner LLP

(57) ABSTRACT

In a method of fabricating a semiconductor device on a substrate having a pillar pattern, a gate electrode is formed on the pillar pattern without etching the latter. A conductive pattern is filled between adjacent pillar patterns, a spacer is formed above the conductive pattern and surrounding sidewalls of each pillar pattern, and the gate electrode is formed by etching the conductive pattern using the spacer as an etch barrier.

18 Claims, 4 Drawing Sheets

SEMICONDUCTOR DEVICE AND METHOD OF FABRICATING THE SAME

CROSS-REFERENCE TO RELATED APPLICATIONS

The present application claims priority of Korean patent application number 10-2008-0030173, filed on Apr. 1, 2008, which is incorporated herein by reference in its entirety.

BACKGROUND

The disclosure relates to a method of fabricating a semiconductor device, and more particularly, to a semiconductor device having a vertical channel and to a method of fabricating such vertical channel in a semiconductor device.

Semiconductor devices having a recess-shape, a bulb-shape and a fin-shape have been developed in order to increase the channel area or channel length. Although the recess-shape semiconductor device, the bulb-shape semiconductor device and the pin-shape semiconductor device can acquire the desired channel length or channel area, there are difficulties in that complex patterns should be formed and cell efficiency should be considered.

Particularly, in the case of a semiconductor having a vertical channel by vertically aligning a source region and a drain region in a pillar pattern, the height of the pillar pattern is relatively high compared to its width. Thus, the pillar pattern may lean over an adjacent pillar pattern or even collapse.

FIG. 1 is a scanning electron microscopic (SEM) picture showing several defective pillar patterns in a semiconductor device known to the inventors.

Referring to FIG. 1, each pillar pattern 11 includes a pillar head 11A and a pillar neck 11B. Since a second width W2 of the pillar neck 11B is smaller than a first width W1 of the pillar head 11A, and due to the relatively high height of the pillar pattern, the pillar pattern's mechanical strength may not be sufficiently strong to sustain itself in the proper vertical orientation. As a result, the pillar pattern may collapse (12), or lean over (13) to adhere to neighboring pillar patterns.

SUMMARY

In accordance with one or more embodiments, a method of fabricating a semiconductor device includes: forming a plurality of pillar patterns over a substrate; forming a conductive pattern between adjacent pillar patterns; forming a spacer above the conductive pattern and surrounding sidewalls of each pillar pattern; and forming a gate electrode by etching the conductive pattern using the spacer as an etch barrier.

In accordance with one or more embodiments, a method of fabricating a semiconductor device includes: forming a plurality of pillar patterns over a substrate; and forming a gate electrode around each pillar pattern without etching the pillar pattern.

In accordance with one or more embodiments, a semiconductor device includes: a substrate having a pillar pattern thereon; a hard mask pattern on top of the pillar pattern; a gate electrode surrounding and covering sidewalls of a lower part of the pillar pattern; and a spacer above the gate electrode and surrounding and covering the sidewall of an upper part of the pillar pattern as well as sidewalls of the hard mask pattern.

BRIEF DESCRIPTION OF THE DRAWINGS

Various embodiments are illustrated by way of example, and not by limitation, in the figures of the accompanying drawings.

DESCRIPTION OF EMBODIMENTS

Figure 1:
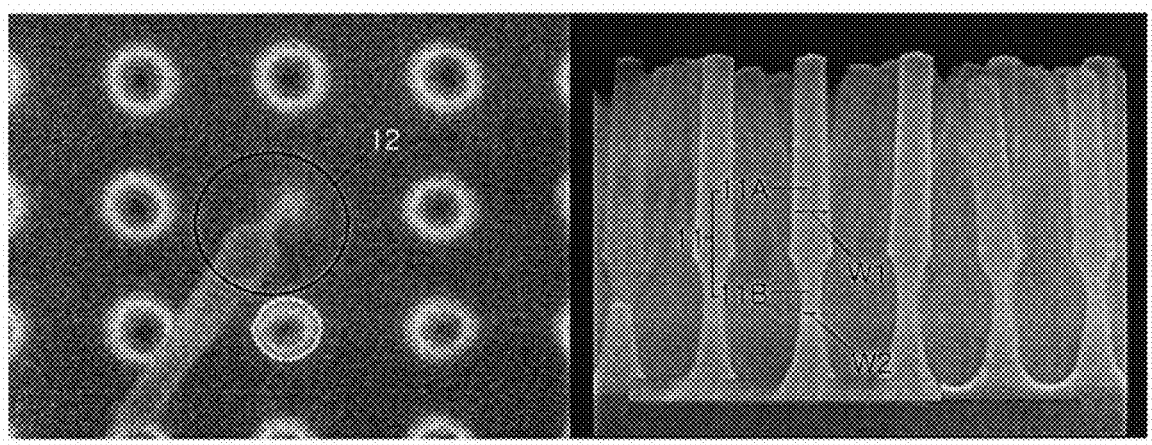
FIG. 1 is a scanning electron microscopic (SEM) picture showing several defective pillar patterns in a known semiconductor device.
Figure 1:
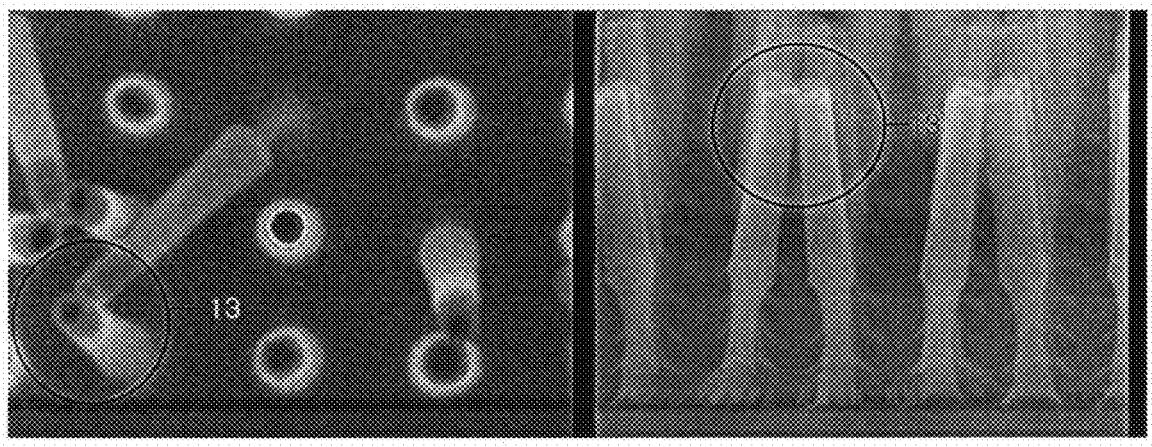

In the drawings, the illustrated thicknesses of layers and regions are exaggerated to facilitate explanation. Furthermore, the same or like reference numerals represent the same or like elements throughout the drawings. It will also be understood that when a layer is referred to as being "on/under" another layer or substrate, it can be directly on/under the other layer or substrate, or intervening layers may also be present. In addition, when a layer is referred to as being 'between' two layers, it can be the only layer between the two layers, or one or more intervening layers may also be present.

Herein, a vertical channel is defined as a channel formed in an up-down direction relative to the substrate supporting the device.

Figure 2A:
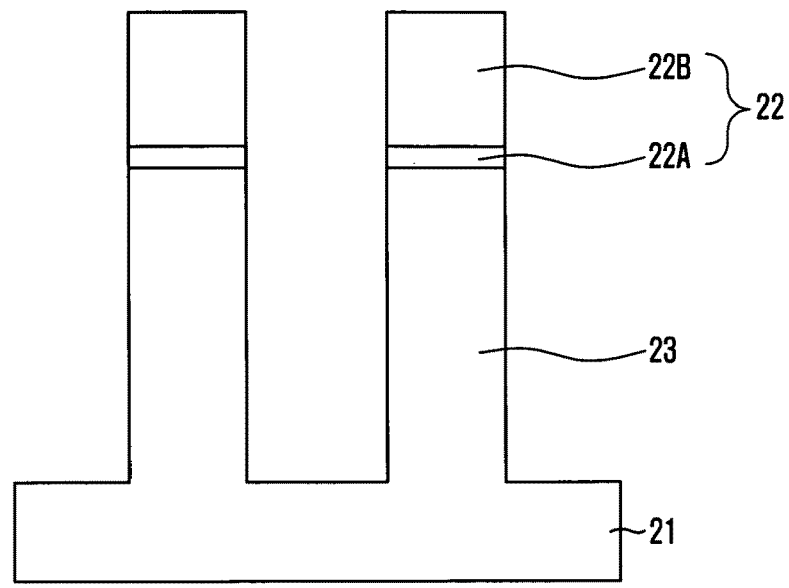
FIGS. 2A to 2E are schematic cross-sectional views illustrating a method of fabricating a semiconductor device having a vertical channel in accordance with some embodiments.

As shown in FIG. 2A, a hard mask layer 22 is formed over a substrate 21, such as and a pillar pattern 23 is formed by etching the substrate 21 using the hard mask layer 22 as an etch barrier or mask.

The pillar pattern 23 includes sidewalls of a vertical profile, has a uniform width, and defines a region where a vertical channel is to be formed. Thus, if the pillar pattern 23 is long, the channel also becomes long.

The hard mask layer 22 in some embodiments has a stack structure including a pad oxide layer 22A and a nitride layer 22B.

Figure 2B:
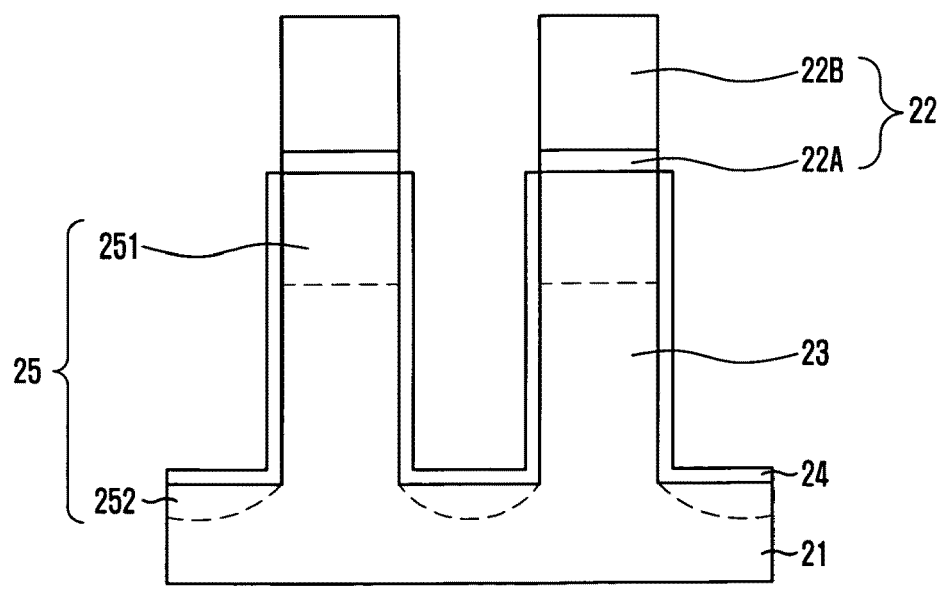

As shown in FIG. 2B, a gate insulation layer 24 is formed over the pillar pattern 23 and the substrate 21. The gate insulation layer 24 is formed by using a deposition or an oxidation process.

Impurity regions 25, including regions 251, 252, are formed over an upper region of the pillar pattern 23 and in the substrate 21 between adjacent pillar patterns 23, respectively. The impurity regions 251, 252 are formed by using an ion implantation process, and configured to function as a source region and a drain region, respectively. Impurity regions 251, 252 can also be configured to respectively function as a drain region and a source region instead.

Figure 2C:
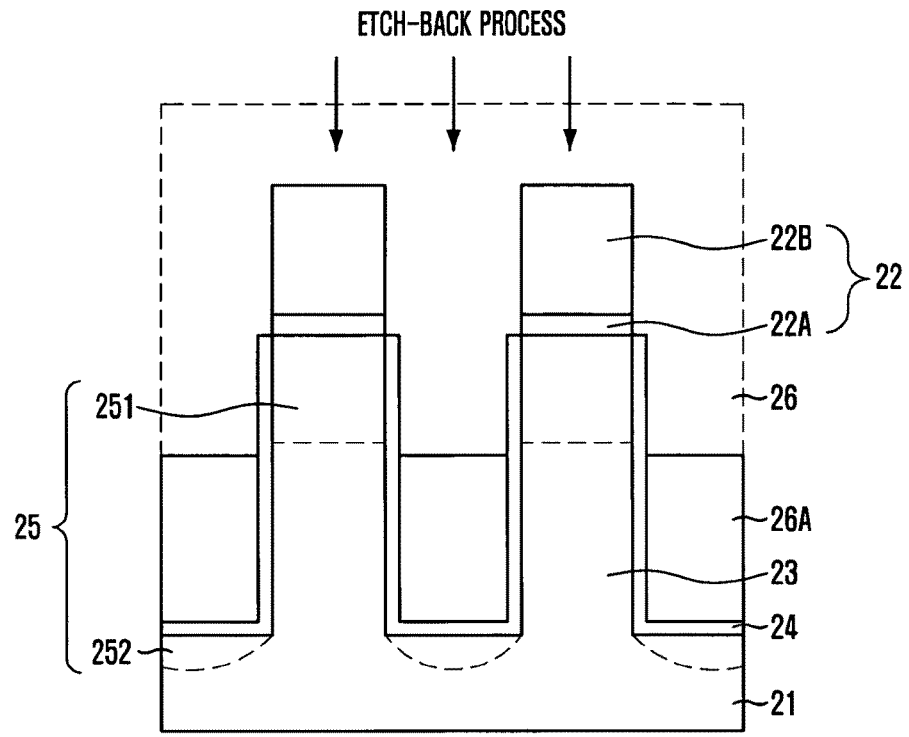

As shown in FIG. 2C, a conductive layer 26 is formed over the resultant structure including the impurity regions 25, and a first conductive pattern 26A surrounding a lower region of each pillar pattern 23 is formed by performing an etch-back process on the conductive layer 26. The first conductive pattern 26A remains between adjacent pillar patterns 23, and between the impurity region 251 formed on the upper region of each pillar pattern 23 and the respective impurity region 252 formed in the substrate 21.

The conductive layer 26 includes a polysilicon layer and/or a metal layer that includes at least one material selected from the group consisting of titanium nitride (TiN), tantalum nitride (TaN), tungsten (W), copper (Cu) and aluminum (Al). For example, the conductive layer 26 in some embodiments includes a stack of copper and aluminum layers.

Figure 2D:
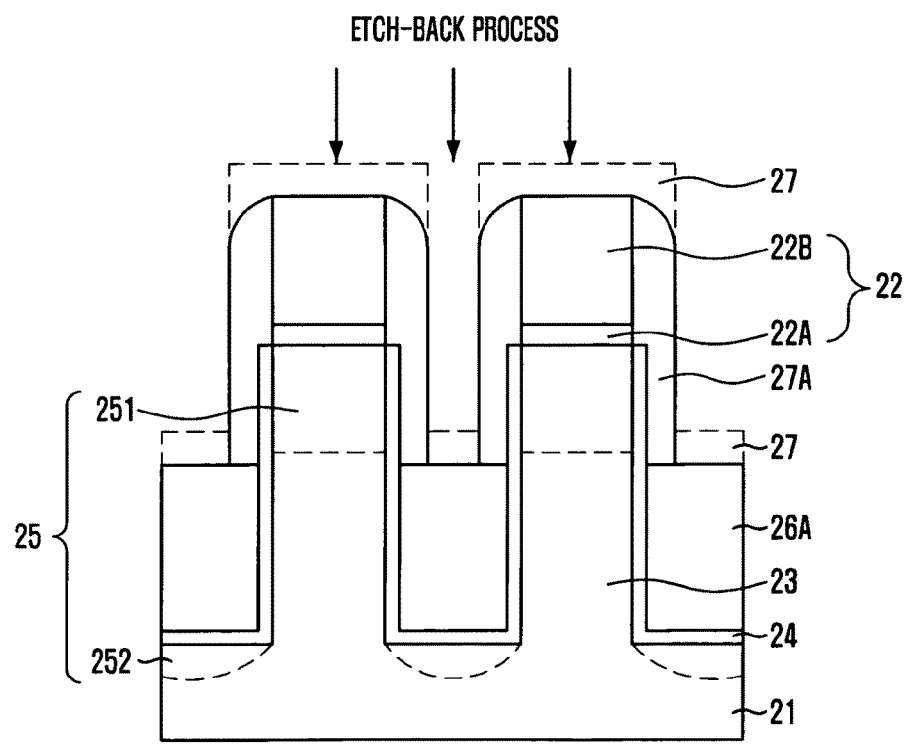

As shown in FIG. 2D, an insulation layer 27 is deposited over the profile of the substrate 21 having the first conductive pattern 26A, and a spacer 27A is formed on sidewalls of the upper region of the pillar pattern 23 and sidewalls of the hard mask layer 22 by performing an etch-back process. The insulation layer 27 may be an oxide layer, a nitride layer or a stack structure including at least an oxide layer and a nitride layer.

Figure 2E:
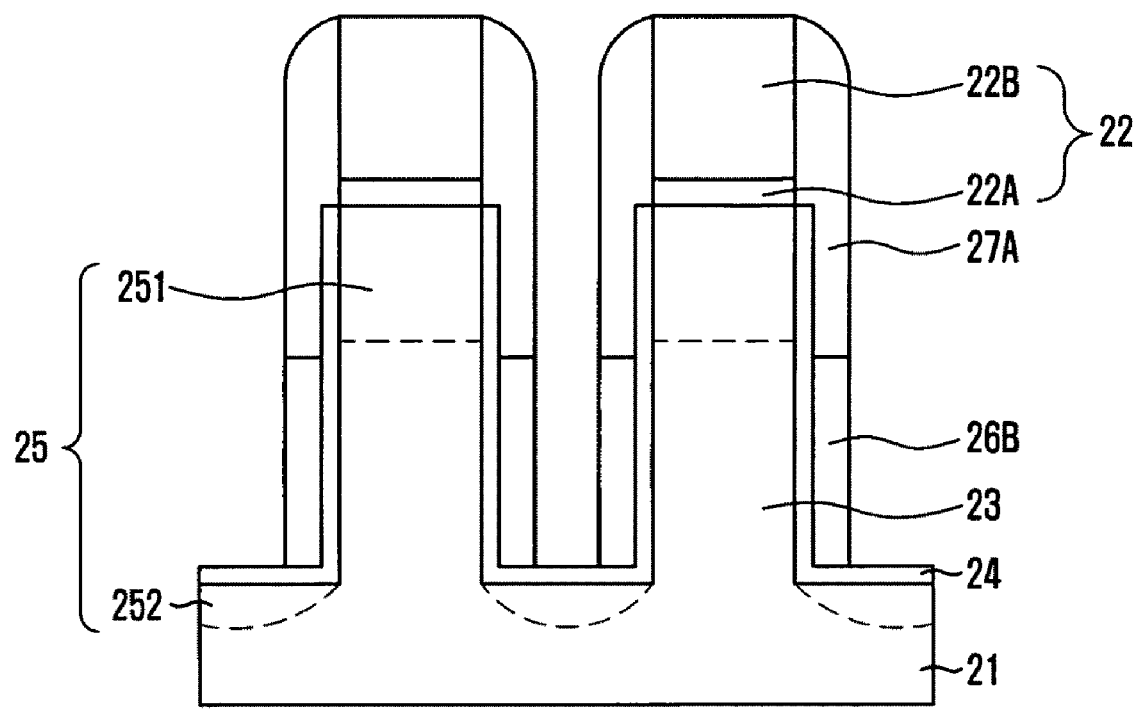

As shown in FIG. 2E, a second conductive pattern 26B is formed by etching the first conductive pattern 26A using the spacer 27A as an etch barrier or mask. The second conductive pattern 26B surrounds the pillar pattern 23 and functions as a gate electrode. Hence, the second conductive pattern 26B is also referred to as the gate electrode.

The spacer 27A remains over the gate electrode 26B during the subsequent processes, and functions as a protection layer of the gate electrode 26B in the subsequent etching processes.

A buried bit line is formed by isolating the impurity region 252 in the substrate 21, and a word line connecting the gate electrodes 26B and a capacitor associated with the pillar pattern 23 are formed to fabricate the semiconductor device.

As described above, the pillar pattern 23 has a uniform width that reduces a possibility that the pillar pattern might lean over or collapse.

In the known device, the gate electrode is formed by performing an etch back process until the substrate is exposed. However, in the disclosed embodiments, the conductive layer 26 is etched in such a manner that the first conductive pattern 26A surrounds the lower region of the pillar pattern 23 as shown in FIG. 2C, and the gate electrode 26B is formed by etching the first conductive pattern 26A using the spacer 27A as an etch barrier or mask.

The amount of the conductive layer lost during the etch-back process may be unacceptably large in the known method, and the hard mask layer may be etched excessively. However, the etched-back amount of the conductive layer 26 to obtain the first conductive pattern 26A is decreased compared to the known method. Thus, an excessive etch of the hard mask layer 22 can be reduced or avoided. In addition, during the etching process performed on the first conductive pattern 26A using the spacer 27A as an etch barrier, an excessive etch of the hard mask layer 22 can be prevented or reduced due to the spacer 27A. Accordingly, the required thickness of the hard mask layer 22 can be reduced compared to the known device/method, and there is a lower likelihood that the pillar pattern 23 might collapse or lean over adjacent pillar patterns.

Thus, by forming the pillar pattern to have a uniform width, the required thickness of the hard mask layer can be reduced, and a likelihood that the uniform width pillar pattern might lean over neighboring pillar patterns or even collapse can be lowered compared to the known device and method.

Therefore, characteristics of the manufactured semiconductor device having a vertical channel can be improved, and the device fabrication yield can be increased.

While embodiments have been described, it will be apparent to those skilled in the art that various changes and modifications may be.

What is claimed is:

1. A method of fabricating a semiconductor device, the method comprising:
    forming a plurality of pillar patterns over a substrate;
    forming impurity regions on (i) an upper region of each pillar pattern to define one of a source region and a drain region and in (ii) the substrate between adjacent pillar patterns to define the other of the source region and the drain region;
    forming a conductive pattern between adjacent pillar patterns;
    forming a spacer above the conductive pattern and surrounding sidewalls of each pillar pattern; and
    forming a gate electrode by etching the conductive pattern using the spacer as an etch barrier.

2. The method of claim 1, wherein each pillar pattern has a uniform width over its height.

3. The method of claim 1, wherein the pillar patterns are formed by:
    forming a plurality of hard mask patterns over the substrate; and
    etching the substrate by using the hard mask patterns as an etch barrier.

4. The method of claim 3, wherein the hard mask patterns comprise a stack structure comprising a pad oxide layer and a nitride layer.

5. The method of claim 3, wherein the spacer is formed to surround side walls of each of the hard mask patterns on top of the respective pillar pattern.

6. The method of claim 5, further comprising forming a gate insulation layer over the sidewalls of each pillar pattern and the substrate;
    wherein
    the conductive pattern is formed to surround and cover a lower part of the gate insulation layer on each pillar pattern, while leaving an upper part of the gate insulation layer on each pillar pattern exposed; and
    the spacer is subsequently formed to surround and cover the exposed upper part of the gate insulation layer, thereby protecting the gate insulation layer during following processes.

7. The method of claim 1, wherein the gate electrode is formed by an etch-back process.

8. The method of claim 1, wherein the spacer comprises an oxide layer, a nitride layer, or a stack structure comprising the oxide layer and the nitride layer.

9. The method of claim 1, wherein the conductive pattern is formed by:
    forming a conductive layer over the substrate including the pillar patterns formed thereon; and
    performing an etch-back process on the conductive layer to form the conductive pattern.

10. The method of claim 9, wherein the conductive layer is a polysilicon layer or a metal layer.

11. The method of claim 10, wherein the metal layer comprises at least one material selected from the group consisting of titanium nitride (TiN), tantalum nitride (TaN), tungsten (W), copper (Cu) and aluminum (Al).

12. The method of claim 1, wherein the spacer is formed by:
    forming an insulation layer over the substrate including the pillar patterns and the conductive pattern formed thereon; and
    performing an etch back process on the insulation layer to form the spacer.

13. The method of claim 1, further comprising
    forming a gate insulation layer over the sidewalls of each pillar pattern and over the substrate between adjacent pillar patterns, to cover the impurity regions formed on the upper regions of the pillar patterns and to cover the impurity regions formed in the substrate between adjacent pillar patterns.

14. The method of claim 13, further comprising:
    after forming said gate insulation layer, forming a conductive layer over the substrate including the pillar patterns formed thereon; and
    performing an etch-back process on the conductive layer, without exposing the gate insulation layer formed over the substrate between adjacent pillar patterns, to obtain the conductive pattern;
    wherein said gate electrode is subsequently formed by etching the conductive pattern using the spacer as an etch barrier to expose the gate insulation layer formed over the substrate between adjacent pillar patterns.

15. A semiconductor device, comprising:

a substrate having a plurality of pillar patterns thereon;

impurity regions on (i) an upper region of each pillar pattern and defining one of a source region and a drain region and in (ii) the substrate between adjacent pillar patterns and defining the other of the source region and the drain region; and for each pillar pattern, a hard mask pattern on top of the pillar pattern;

a gate electrode surrounding and covering sidewalls of a lower region of the pillar pattern; and a spacer above the gate electrode and surrounding and covering sidewalls of the upper region of the pillar pattern as well as sidewalls of the hard mask pattern.

16. The device of claim 15, further comprising a gate insulation layer extending between (i) each pillar pattern and (ii) the respective gate electrode and the respective spacer over a height of the pillar pattern.

17. The device of claim 16, wherein the sidewalls of the hard mask pattern are free of the gate insulation layer.

18. The device of claim 16, wherein each pillar pattern has a uniform width over the entire height thereof.

* * * * *